(12) United States Patent
Miller

(10) Patent No.: US 7,768,777 B2
(45) Date of Patent: Aug. 3, 2010

(54) ELECTRONIC PACKAGE WITH DIRECT COOLING OF ACTIVE ELECTRONIC COMPONENTS

(75) Inventor: Charles A. Miller, Fremont, CA (US)

(73) Assignee: FormFactor, Inc., Livermore, CA (US)

(*) Notice: Subject to any disclaimer, the term of this patent is extended or adjusted under 35 U.S.C. 154(b) by 0 days.

(21) Appl. No.: 12/246,969

(22) Filed: Oct. 7, 2008

(65) Prior Publication Data

US 2009/0032938 A1  Feb. 5, 2009

Related U.S. Application Data

(60) Division of application No. 11/472,048, filed on Jun. 20, 2006, now Pat. No. 7,433,188, which is a continuation of application No. 10/026,469, filed on Dec. 27, 2001, now Pat. No. 7,064,953.

(51) Int. Cl.
*H05K 7/20* (2006.01)
(52) U.S. Cl. .................. 361/679.53; 361/698; 361/699; 165/104.33; 62/259.2
(58) Field of Classification Search .......... 361/679.46, 361/679.47, 679.53, 689, 699–712, 715–719; 257/713–715; 165/80.2, 80.4, 80.5, 104.33, 165/185; 62/3.1, 3.2, 259.2; 29/832, 846, 29/884, 885, 842, 850–857, 881; 324/158.1, 324/670, 760, 685, 721
See application file for complete search history.

(56) References Cited

U.S. PATENT DOCUMENTS

| 4,000,509 | A | 12/1976 | Jarvela |
| 4,245,273 | A | 1/1981 | Feinberg et al. |
| 4,561,040 | A | 12/1985 | Eastman et al. |
| 4,757,255 | A | 7/1988 | Margozzi |
| 4,778,326 | A | 10/1988 | Althouse et al. |
| 4,820,976 | A | 4/1989 | Brown |
| 4,839,774 | A | 6/1989 | Hamburgen |
| 4,860,444 | A | 8/1989 | Herrell et al. |
| 4,954,774 | A | 9/1990 | Binet |
| 5,021,924 | A | 6/1991 | Kieda et al. |
| 5,054,192 | A | 10/1991 | Cray et al. |

(Continued)

FOREIGN PATENT DOCUMENTS

DE  2938096  4/1981

(Continued)

OTHER PUBLICATIONS

The article: "Hermetically Sealed, Field Removable Module Having Integral Pump and Coolant Heat Exchanger for Convection Immersion Cooling of Electronic Circuit Modules.", IBM Technical Disclosure Bulletine, SDeptember 1992, vol. 35; Issue 4B; pp. 443-444.*

(Continued)

*Primary Examiner*—Michael V Datskovskiy
(74) *Attorney, Agent, or Firm*—N. Kenneth Burraston

(57) ABSTRACT

A cooling assembly includes a package with one or more dies cooled by direct cooling. The cooled package includes one or more dies with active electronic components. A coolant port allows a coolant to enter the package and directly cool the active electronic components of the dies.

9 Claims, 14 Drawing Sheets

U.S. PATENT DOCUMENTS

| | | | |
|---|---|---|---|
| 5,102,343 A | 4/1992 | Knight et al. | |
| 5,198,752 A | 3/1993 | Miyata et al. | |
| 5,198,753 A | 3/1993 | Hamburgen | |
| 5,476,211 A | 12/1995 | Khandros | |
| 5,550,482 A | 8/1996 | Sano | |
| 5,568,054 A | 10/1996 | Iino et al. | |
| 5,650,914 A | 7/1997 | DiStefano et al. | |
| 5,690,749 A | 11/1997 | Lee | |
| 5,719,444 A * | 2/1998 | Tilton et al. | 257/714 |
| 5,834,946 A | 11/1998 | Albrow et al. | |
| 5,854,092 A | 12/1998 | Root et al. | |
| 5,889,651 A | 3/1999 | Sasaki et al. | |
| 5,917,707 A | 6/1999 | Khandros et al. | |
| 5,986,447 A | 11/1999 | Hanners et al. | |
| 6,012,224 A | 1/2000 | DiStefano et al. | |
| 6,031,720 A | 2/2000 | Crane | |
| 6,033,935 A | 3/2000 | Dozier, II et al. | |
| 6,056,627 A | 5/2000 | Mizuta | |
| 6,064,213 A | 5/2000 | Khandros et al. | |
| 6,078,500 A | 6/2000 | Beaman et al. | |
| 6,085,831 A | 7/2000 | DiGiacomo et al. | |
| 6,110,823 A | 8/2000 | Eldridge et al. | |
| 6,140,616 A | 10/2000 | Andberg | |
| 6,169,409 B1 | 1/2001 | Amemiya | |
| 6,184,053 B1 | 2/2001 | Eldridge et al. | |
| 6,184,065 B1 | 2/2001 | Smith et al. | |
| 6,191,599 B1 * | 2/2001 | Stevens | 324/760 |
| 6,205,799 B1 | 3/2001 | Patel et al. | |
| 6,232,149 B1 | 5/2001 | Dozier, II et al. | |
| 6,255,126 B1 | 7/2001 | Mathieu et al. | |
| 6,268,015 B1 | 7/2001 | Mathieu et al. | |
| 6,313,652 B1 | 11/2001 | Maeng | |
| 6,451,709 B1 | 9/2002 | Hembree | |
| 6,459,581 B1 | 10/2002 | Newton et al. | |
| 6,468,098 B1 | 10/2002 | Eldridge | |
| 6,534,586 B2 | 3/2003 | Tsuji et al. | |
| 6,534,856 B1 | 3/2003 | Dozier et al. | |
| 6,545,493 B1 | 4/2003 | Iino | |
| 6,550,263 B2 * | 4/2003 | Patel et al. | 62/259.2 |
| 6,708,515 B2 * | 3/2004 | Malone et al. | 62/259.2 |
| 6,727,580 B1 | 4/2004 | Eldridge et al. | |
| 6,825,681 B2 | 11/2004 | Feder et al. | |
| 6,838,896 B2 | 1/2005 | Leedy | |
| 6,891,385 B2 | 5/2005 | Miller | |
| 6,971,793 B2 | 12/2005 | Tsui et al. | |
| 6,985,000 B2 | 1/2006 | Feder et al. | |
| 7,032,392 B2 * | 4/2006 | Koeneman et al. | 62/77 |
| 7,049,841 B2 | 5/2006 | Yamashita | |
| 7,064,953 B2 | 6/2006 | Miller | |
| 7,190,184 B2 | 3/2007 | Haji-Sheikh et al. | |
| 7,433,188 B2 | 10/2008 | Miller | |
| 7,579,847 B2 | 8/2009 | Miller | |
| 2002/0004320 A1 | 1/2002 | Pedersen et al. | |
| 2002/0172007 A1 | 11/2002 | Pautsch | |
| 2005/0206397 A1 | 9/2005 | Miller | |
| 2008/0088010 A1 | 4/2008 | Hobbs et al. | |

FOREIGN PATENT DOCUMENTS

| | | |
|---|---|---|
| EP | 0261829 | 3/1988 |
| EP | 0709884 | 5/1996 |
| JP | 403139899 | 6/1991 |
| JP | 10-506197 | 6/1998 |
| JP | 10-223704 | 8/1998 |
| JP | 11-504725 | 4/1999 |
| JP | 2000-28641 | 1/2000 |
| JP | 2001-102418 | 4/2001 |
| TW | 468367 | 12/2001 |
| TW | 459139 | 10/2007 |
| WO | WO 95/14314 | 5/1995 |
| WO | WO 96/15458 | 5/1996 |
| WO | WO 96/17378 | 6/1996 |
| WO | WO 97/43654 | 11/1997 |
| WO | WO 98/52224 | 11/1998 |
| WO | WO 98/53330 | 11/1998 |
| WO | WO 00/33089 | 6/2000 |
| WO | WO 01/13113 | 2/2001 |

OTHER PUBLICATIONS

"Cooling System For Semiconductor Modules," IBM Technical Disclosure Bulletin, vol. 26, No. 3B (Aug. 1983), p. 1548.

Advanced Electronic Packaging-With Emphasis on Multichip Modules, William D. Brown, (Ed.) "13.5 Competitive Mainframe Packaging Examples," pp. 547-550, IEEE (1999).

Electronic Packaging and Interconnection Handbook, Editor-in-Chief by Charles A. Harper, "2.7 High Heat-Load Cooling," pp. 2.57-2.66, Third Edition (2000), McGraw-Hill.

U.S. Appl. No. 12/547,260, filed Aug. 25, 2009, Miller.

* cited by examiner

ELECTRONIC PACKAGE WITH DIRECT COOLING OF ACTIVE ELECTRONIC COMPONENTS

BACKGROUND OF THE INVENTION

1. Field of the Invention

The present invention relates to electronic packaging.

2. Related Art

An electronic package can house one or more dies, however, active electronic components on a die generate heat during operation. Such heat needs to be removed from a package to avoid overheating and reduced performance. The need for thermal management becomes greater as the number of dies desired to be housed in a single package increases and the operating load of each die increases. For example, thermal management is a significant concern for high-density packages which include multiple dies in a relatively small area. Further, dies are continually expected to include greater numbers of active electronic components such as transistors, and to operate at ever greater clock rates and input/output (IO) speeds. The need to dissipate heat is even more important in high-density packages with dies carrying out significant processing operations at high clock rates.

Two conventional approaches developed by IBM Corp. and NEC Corp. address the problem of heat dissipation on a package level basis in high-performance computers. The IBM approach uses a thermal conduction module (TCM) to cool a high-density flip chip multi-chip module (MCM). This approach however is limited to back side cooling. Active surfaces of dies which are flip-chip bonded only face a substrate and are not directly cooled. Uneven thermal gradients and hots spots can still occur on active die surfaces. The NEC approach provides liquid cooling modules (LCMs). However, these LCMs only contact the exterior of an entire package. In this case too, cooling the package exterior does not directly cool active surfaces of flip-chip bonded dies in a package. Uneven thermal gradients and hot spots can still arise across the dies. See, e.g., *Advanced Electronic Packaging with Emphasis on Multichip Modules*, edited by W. Brown, Chapter 13, "Mainframe Packaging: The Thermal Conduction Module," published by I.E.E.E. Press, Piscataway, N.J., 1999, pp. 492-565. More effective cooling of active electronic components within an electronic package is needed.

BRIEF SUMMARY OF THE INVENTION

The present invention provides direct cooling of active electronic components within an electronic package. A cooled package includes one or more dies. Each die is directly cooled on one or more sides by a coolant present within the cooled package. In this way, heat generated by active electronic components on one or more surfaces of a die is transferred away from the active electronic components. Such direct cooling of die surfaces in an electronic package according to the present invention minimizes temperature variation across each die and reduces electrical parameter variation. Hence, the uniformity of output signal characteristics such as rise time and pin-to-pin skew is improved. Hot spots on a die surface are reduced or eliminated, allowing the operating temperature range of a die to be increased.

In one embodiment, a cooled package includes a housing that encloses a cavity. The housing has at least one coolant port that allows a coolant to circulate within the cavity. Each die is mounted on a substrate within an enclosed and sealed cavity in which coolant is circulated. In one example, one die is mounted within the cavity of the housing. In another example, a plurality of dies are mounted within the cavity of the housing. In another example, a high-density cooled package is provided in which an array of densely packed dies are arranged within the cavity of the housing. In another example, a high-density cooled package includes an array of densely packed dies mounted such that die surfaces with active electronic components face a substrate within the cavity of the housing.

In one embodiment, a housing of a cooled package includes top and bottom substrates coupled by a seal. A cooling system is coupled to a coolant circulation system to provide liquid and/or gas coolant into and out of one or more coolant ports in the housing. In one arrangement, the housing includes two coolant ports. For example, two ports such as one-way flow valves can be provided in an O-ring seal coupling the top and bottom substrates. One port passes coolant into the cavity and the other port passes coolant out of the cavity. In this way, heat is transferred directly away from the active surfaces of the dies.

According to a further feature, one or more dies include compliant interconnects coupled to at least one substrate. Such compliant interconnects allow coolant to circulate around all surfaces of the dies within the cavity while maintaining effective structural and electrical contact between each die and the substrate. In preferred embodiments of the present invention, the compliant interconnects are spring contacts which couple a die to a bottom substrate. Dies can be soldered to the spring contacts or held with the aid of alignment posts in a socket configuration. The spring contacts provide a flexible, resilient stand-off. Liquid or gas coolant flows between the substrate and one or more sides of each die. The coolant makes direct contact with each die surface including the active die surface provide uniform cooling even for high-power applications. Such spring contacts allow coolant circulation and heat transfer away from active surfaces of dies even when the dies are mounted to face a substrate within the cavity of a housing.

According to a further feature, non-contacting compliant interconnects are also provided on a die surface. A non-contacting compliant interconnect can be any type of compliant interconnect such as a spring. These non-contacting compliant interconnects do not contact a substrate, but serve to direct heat away from areas of the die surface. This further improves cooling of die(s) in a cooled package according to the present invention.

In one embodiment, a cooled package includes one or more dies mounted in a stacked die arrangement. In this arrangement, one or more dies are flip-chip bonded to a top substrate. The top substrate is then coupled by compliant interconnects to a bottom substrate.

In one embodiment of a cooled package according to the present invention, contacts are provided on a cooled package to electrically connect each die with external components. In one embodiment, contacts are provided at a peripheral edge of the bottom substrate. In another embodiment, contacts are provided at a top substrate. Electrical connections can be coupled to the contacts. According to a further feature, additional electrical connections run through a cooled package directly between top and bottom substrates.

An advantage of the present invention is that embodiments of the present invention can include one or more dies which carry out high-power processing operations without reaching an overheating condition that degrades signal quality to an unacceptable level. A further advantage of a cooled high-density package embodiment according to the present invention is that it can compactly house a number of dies. In a compact embodiment, the size of the cavity within the package (also called the packaged component area) is only slightly larger than the footprint of the dies themselves.

One additional advantage of an electronic package with direct cooling according to the present invention is it is easy to disassemble for maintenance and repair. Another advantage of an electronic package with direct cooling according to the present invention is that it is inexpensive to assemble. Another advantage is that in certain embodiments electrical interconnects can be made to both the top and bottom of the package.

Further, in another embodiment, an electronic package according to the present invention includes a cooling member and a cooled package with one or more heat radiators such as cooling fins. The cooled package includes a housing that encloses a cavity. A coolant fills the cavity. One or more dies are mounted through compliant interconnects to a substrate within the cavity and are directly cooled by surrounding coolant. In this embodiment, however, heat is transferred away from the coolant by one or more heat radiators to the cooling member.

According to another embodiment, a method for direct cooling of active electronic components is provided. The method includes attaching active electronic components to a substrate with an active surface facing the substrate, sealing the attached active electronic components in a package, and circulating coolant through the package to directly contact the active surfaces of the active electronic components.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. In the accompanying drawings:

FIG. 4C is a diagram that illustrates non-contacting compliant interconnects provided on a die surface according to a further feature of the present invention.

FIGS. 8-11 are diagrams of types of spring contacts that can be used in a cooled package according to a further feature of the present invention. FIGS. 9A, 9B, 10A-10C and 11 illustrate examples of lithographic spring contacts.

DETAILED DESCRIPTION OF THE INVENTION

Table of Contents

1. Overview and Discussion

2. Terminology

Figure 1:
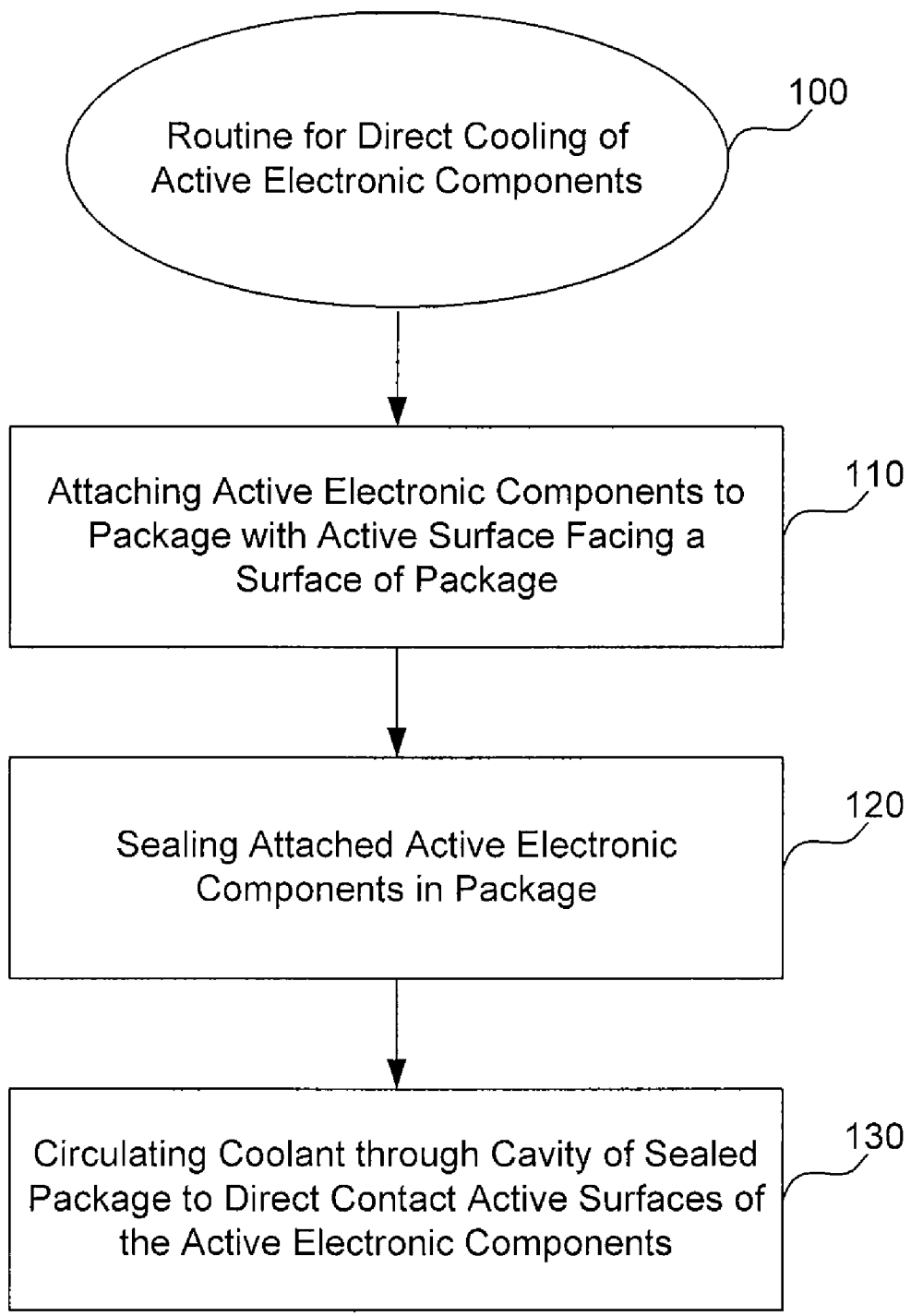
FIG. 1 is a flowchart of a routine for direct cooling of active electronic components according to an embodiment of the present invention.

3. Routine for Direct Cooling of Active Electronic Components

4. Cooling Assembly

5. Cooled Package with One or More Dies

6. High-Density Cooled Packages

7. Cooled Package with Heat Radiator

8. Types of Spring Contacts

9. Conclusion

The following description is for the best modes presently contemplated for practicing the invention. This description is not to be taken in a limiting sense, but is made merely for the purpose of describing the general principles of the invention. The scope of the invention should be ascertained with reference to the claims. In the description of the invention that follows, like numerals or reference designators will be used to refer to like parts or elements throughout.

1. Overview and Discussion

The present invention provides a cooling assembly. The cooling assembly includes a cooled package with one or more dies. Each die is directly cooled on one or more sides by a coolant present within the cooled package. Embodiments of the present invention are described with respect to a cooled high-density package. The present invention can include but is not limited to a cooled high-density package. In general, a cooled package according to the present invention can include only one die or a plurality of dies arranged in any configuration or layout within the cooled package.

The present invention is described in terms of an electronic packaging environment. Description in these terms is provided for convenience only. It is not intended that the invention be limited to application of these example environments. In fact, after reading the following description, it will become apparent to a person skilled in the relevant art how to implement the invention in alternative environments known now or developed in the future.

2. Terminology

To more clearly delineate the present invention, an effort is made throughout the specification to adhere to the following term definitions as consistently as possible.

The term "die" refers to any integrated circuit, chip, silicon chip or other semiconductor or electronic device.

The terms "interconnect" and "interconnection element" refer to any electrical connection, including but not limited to a compliant interconnect.

The term "compliant interconnect" refers to a non-rigid electrical connection including, but not limited to, a spring contact available from FormFactor, Inc. and the types of spring contacts described herein.

The term "active electronic component" refers to any heat generating electronic component including but not limited to a transistor, switch, resistor, logic gate, or integrated circuit.

The term "direct cooling of an active electronic component" as used to describe the present invention refers to influencing the temperature of an active electronic component with a coolant placed in thermal contact with the active electronic component.

The term "attached" as used herein refers to any type of direct or indirect coupling.

3. Routine for Direct Cooling of Active Electronic Components

FIG. 1 is a flowchart of a routine 100 for direct cooling of active electronic components according to an embodiment of the present invention. (Steps 110-130). In step 110, active electronic components are attached to a package with an active surface facing an interior surface of the package. The active electronic components can be directly or indirectly coupled to the package. In embodiments, one or more dies with active electronic components are coupled through interconnection elements to a substrate such that the active electronic components face the substrate. A socket configuration can also be used to hold one or more dies relative to the substrate such that the active electronic components face the substrate. In one example, the attaching step involves coupling each die to a substrate through one or more compliant interconnects.

In step 120, the attached active electronic components are sealed in the package. In step 130, a coolant is circulated through the package to directly contact the active surfaces of the active electronic components.

4. Cooling Assembly

Figure 2:
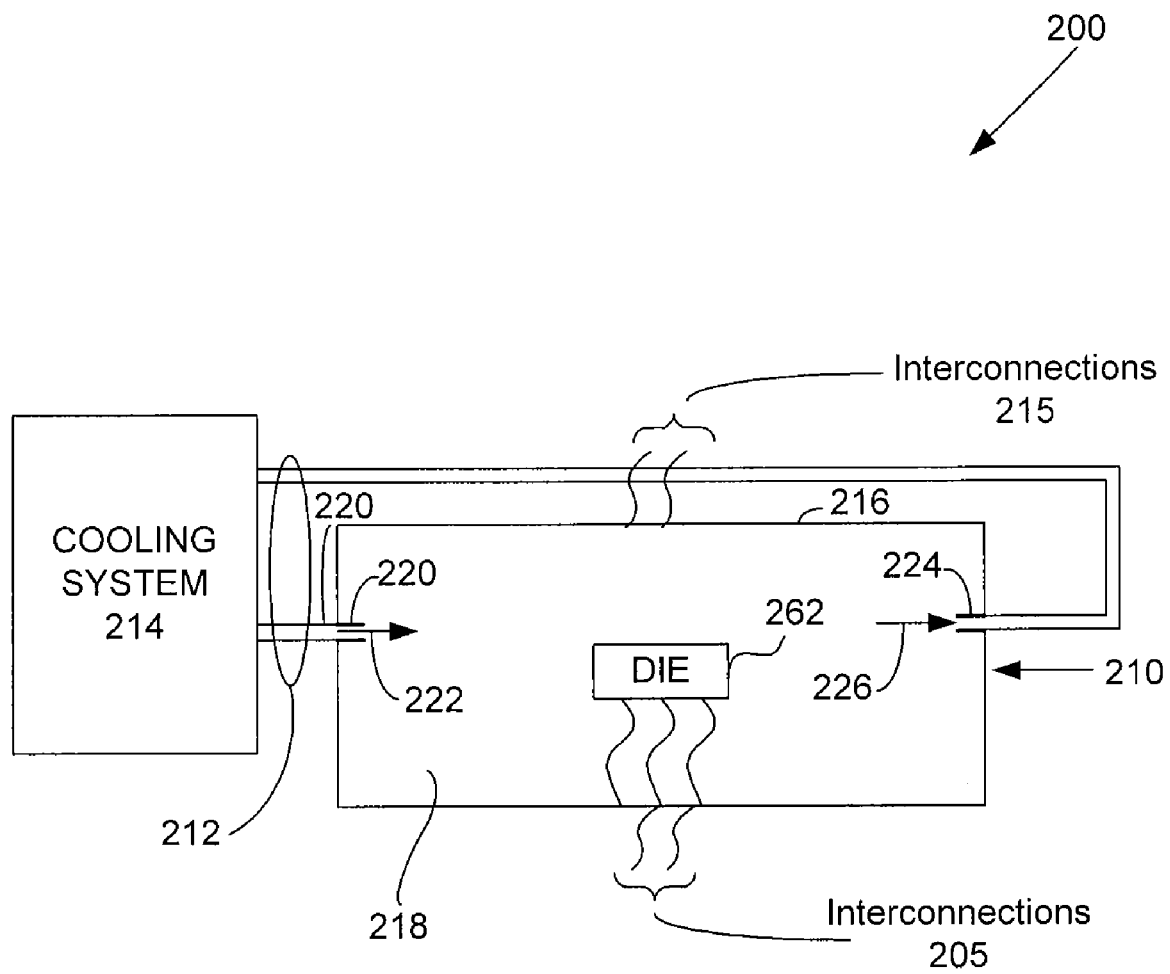
FIG. 2 is a diagram of a cooling assembly and cooled package according to an embodiment of the present invention.

FIG. 2 is a diagram of a cooling assembly 200 according to the present invention. Cooling assembly 200 includes cooled package 210, coolant circulation system 212, and cooling system 214. One or more electrical interconnections 205 and 215 are coupled to cooled package 210. Electrical interconnections 205 and 215 carry signals to and from active electronic components within cooled package 210. Electrical interconnections 205 and 215 can be any type of electrical interconnection including but not limited to compliant interconnects. Electrical interconnection 205 is shown extending from the bottom of cooled package 210. Electrical interconnection 215 is shown extending from the top of cooled package 210. Contacts (not shown) are provided on an exterior surface of a housing 216 to couple interconnections 205, 215 to the cooled package 210. These are example placements only and not intended to limit the present invention. Electrical interconnections 205 and 215 can also be placed in a variety of locations around cooled package 210 depending upon a desired configuration. Any type of contact for a cooled package can be used including, but not limited to, bumps, pads, solder columns, contact elements, land grid array (LGA) pattern, etc. Example output contacts are further described with respect to interconnection elements used in the high-density cooled packages of FIGS. 4-6.

Cooled package 210 is a package that includes one or more dies 262. Each die 262 has one or more active electronic components. The active components are arranged on an active surface of a die or in layers near the active surface depending the particular construction of the die. The package includes a housing 216 that encloses a cavity 218. In certain embodiments, only one die or a plurality of dies 262 are arranged within the cavity. In other embodiments, cooled package 210 is a high-density package with a plurality of dies arranged in a compact configuration. Examples of cooled packages having one or more dies are described below with respect to FIGS. 3A-3C and 7. Further examples of cooled high-density packages according to the present invention are described below with respect to FIGS. 4-6.

The housing of cooled package 210 further includes at least one coolant port 220 coupled to the coolant circulation system 212. Coolant is introduced into cavity 218 as shown by the directional arrow 222 and directly contacts active electronic components. Active electronic components can be positioned at or near one or more surfaces of a die so that heat is transferred from the surfaces to the coolant. Coolant circulates throughout cavity 218 and exits at a second coolant port 224 as shown by directional arrow 226. Moreover, in embodiments, the coolant can directly contact most or all of a surface area on one or more sides of a die. In this way, hot spots and thermal gradients are reduced or eliminated.

Cooling system 214 is coupled through coolant circulation system 212 to the coolant ports 220, 224 of cooled package 210. Coolant circulation system 212 can be any type of pipe or conduit for carrying coolant to and from cooled package 210 and cooling system 214. Cooling system 214 is any type of conventional cooling system for circulating coolant and transferring heat. Multiple ports and mechanical devices can be used to evenly distribute coolant within a cavity or to distribute coolant in a particular way. In one example, a tank holding liquid coolant is used in cooling system 214. Pumps are used to drive liquid to and from the coolant circulation system 212. A refrigerator coil is provided in the tank to cool the coolant to a desired temperature. A heater coil can also be added to the tank if further control of the temperature of the coolant is desired.

Cooling system 214 can circulate any type of liquid coolant and/or gas coolant. Example types of coolant include, but are not limited to, ethylene glycol, liquified nitrogen, fluorocarbons, FLORINERT, FREON, and a combination of FREON and a nonfreezing liquid.

Figure 3A:
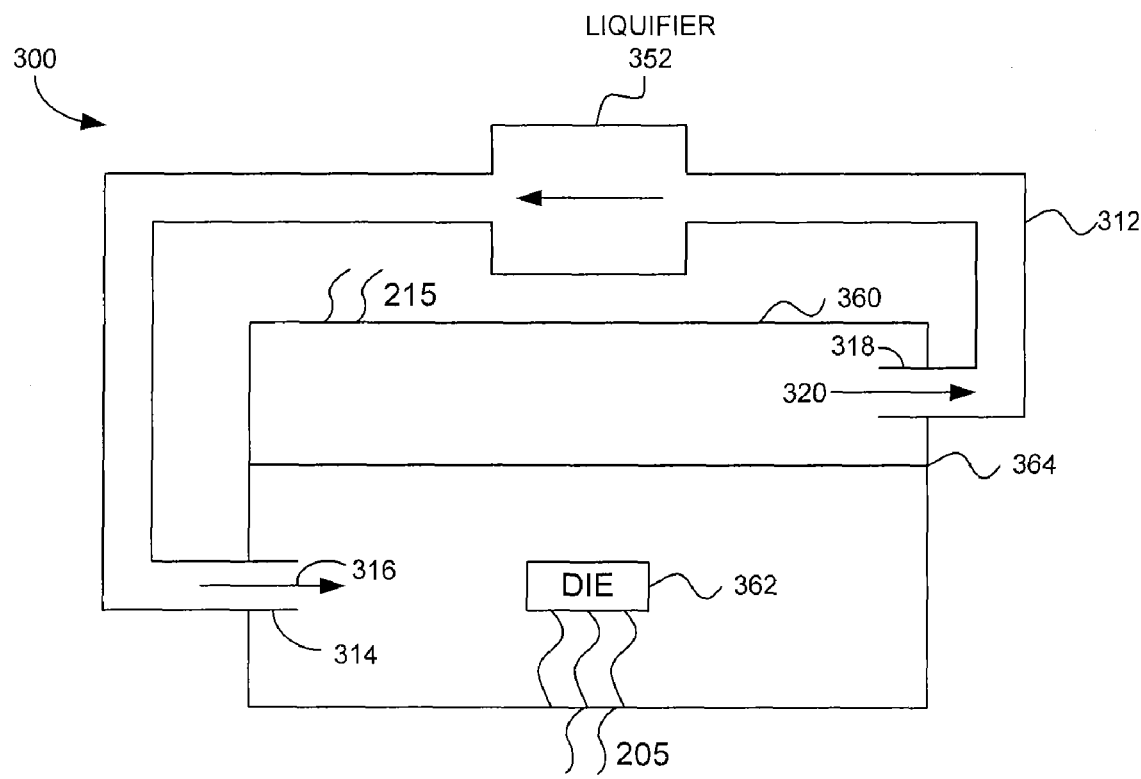
FIG. 3A is a diagram of a cooling assembly and cooled package according to an embodiment of the present invention.
Figure 3B:
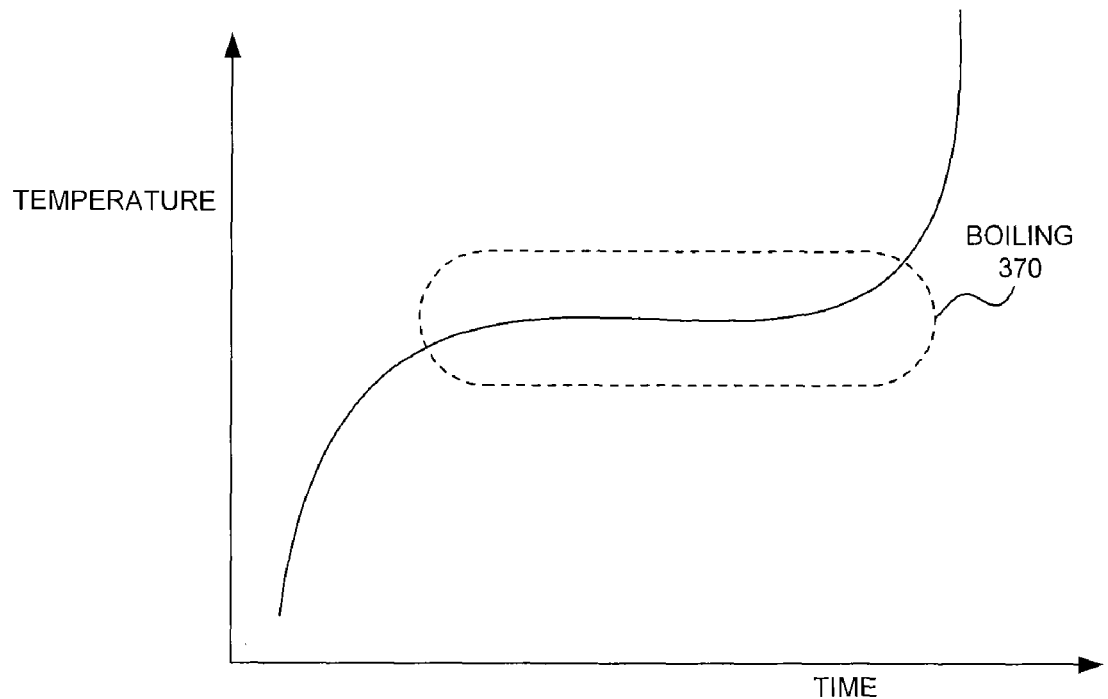
FIG. 3B is an example plot that illustrates the principle of how a liquid coolant generally remains at a constant temperature throughout a boiling range during operation of the cooling assembly shown in FIG. 3A.

FIG. 3A shows another embodiment of a cooling assembly 300. Cooling assembly 300 includes a liquid coolant that boils at about the desired operating temperature of a die. Coolant flows through coolant circulation system 312 at entry port 314, as shown by directional arrow 316, into a housing 360 so that one or more dies 362 are immersed in the liquid coolant below a coolant level 364. During operation, each die 362 may generate sufficient heat to cause microboiling near active surfaces of the die. Such microboiling converts some of the liquid coolant into a gas. This provides an additional advantage in that the liquid coolant surrounding each die 362 generally remains at a constant temperature during boiling. This increases the operating temperature range of each die. FIG. 3B is plot that illustrates the principle of how a liquid coolant generally remains at a constant temperature during a boiling range 370. A combination of liquid and gas (or gas only) then exits housing 360 at exit port 318, as shown by directional arrow 320, and travels through coolant circulation system 312 to liquifier 352. Liquifier 352 converts the coolant from a gas phase back into a liquid phase before pumping or circulating the coolant back into housing 360.

Electrical interconnections 205, 215 are coupled to housing 360 to pass electrical signals in and out of the housing 360 and each die 362. Electrical interconnection 205 is shown extending from the bottom of housing 360. Electrical interconnection 215 is shown extending from the top of housing 360. Contacts (not shown) are provided on housing 360 to couple interconnections 205, 215 to housing 360. These are example placements only and not intended to limit the present invention. A number of electrical interconnections 205 and 215 can also be placed in a variety of locations around housing 360 depending upon a desired configuration.

Examples of cooled packages are now described in further detail with respect to FIGS. 3C-7. These examples are illustrative and not intended to limit the present invention.

5. Cooled Package with One or More Dies

Figure 3C:
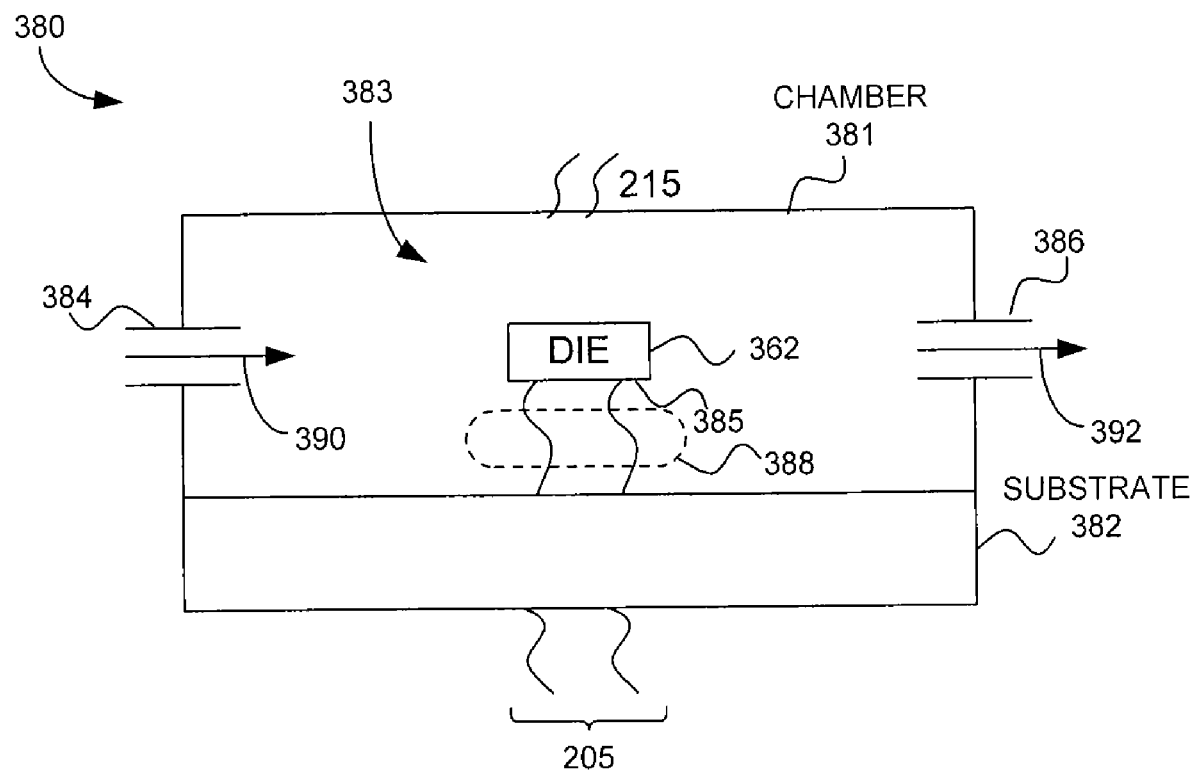
FIG. 3C is a diagram of a cooled package according to an embodiment of the present invention.

FIG. 3C is a diagram of a cooled package 380 according to a further embodiment of the present invention. Cooled package 380 includes a housing made up of a chamber 381 and bottom substrate 382. Chamber 381 can be made from ceramic, stamped metal, molded plastic, cast metal, etc. Bottom substrate 382 can be any type of substrate including, but not limited to, a substrate made of FR-4, ceramic, copper-invar-copper, etc.

One or dies 362 are coupled to a surface of bottom substrate 382 within a cavity 383 in chamber 381. One die 362 may be used as shown in FIG. 3C. Alternatively, a plurality of dies 362 may be used. Die(s) 362 can be arranged in any desired layout on the surface of the bottom substrate 382. Each die 362 is coupled to bottom substrate 382 through respective interconnects 388. Interconnects 388 can be any type of electrical interconnection element including, but not limited to, compliant interconnects. Examples of compliant interconnects are further described below. In one preferred embodiment, each die 362 is coupled to bottom substrate 382 through respective groups of compliant interconnects 388. Die(s) 362 are further mounted such that an active surface 385 of a die 362 faces toward an inside surface of bottom substrate 382.

In FIG. 3C, two coolant ports 384, 386 are shown. Coolant port 384 allows coolant to pass into chamber 381 as shown by directional arrow 390. Coolant port 386 allows coolant within chamber 381 to exit as shown by directional arrow 392. In one example, coolant ports 384, 386 are one-way fluid flow valves. In other examples, one port or many ports of any type can be used. Such ports and/or other mechanical devices can permit a one-way or two-way flow of coolant.

Within a cavity in chamber 381, the coolant freely circulates around all sides of die(s) 362 and interconnects 388. The coolant directly cools active electronic components on die(s) 362. In this way, the present invention reduces the magnitude of thermal gradients across each die and makes remaining thermal gradients (if any) more even across each die. Hot spots are reduced or eliminated.

Electrical interconnections 205, 215 pass electrical signals in and out of chamber 381 and each die 362. Electrical interconnection 205 is shown extending from the bottom of substrate 382. Electrical interconnection 215 is shown extending from the top of chamber 381. Contacts (not shown) are provided on substrate 382 to couple interconnections 205 to the substrate. Contacts (not shown) are also provided on chamber 381 to couple interconnections 215 to the chamber. These are example placements only and not intended to limit the present invention. A number of electrical interconnections 205 and 215 (and associated contacts) can also be placed in a variety of locations depending upon a desired configuration.

6. High-Density Cooled Packages

Figure 4A:
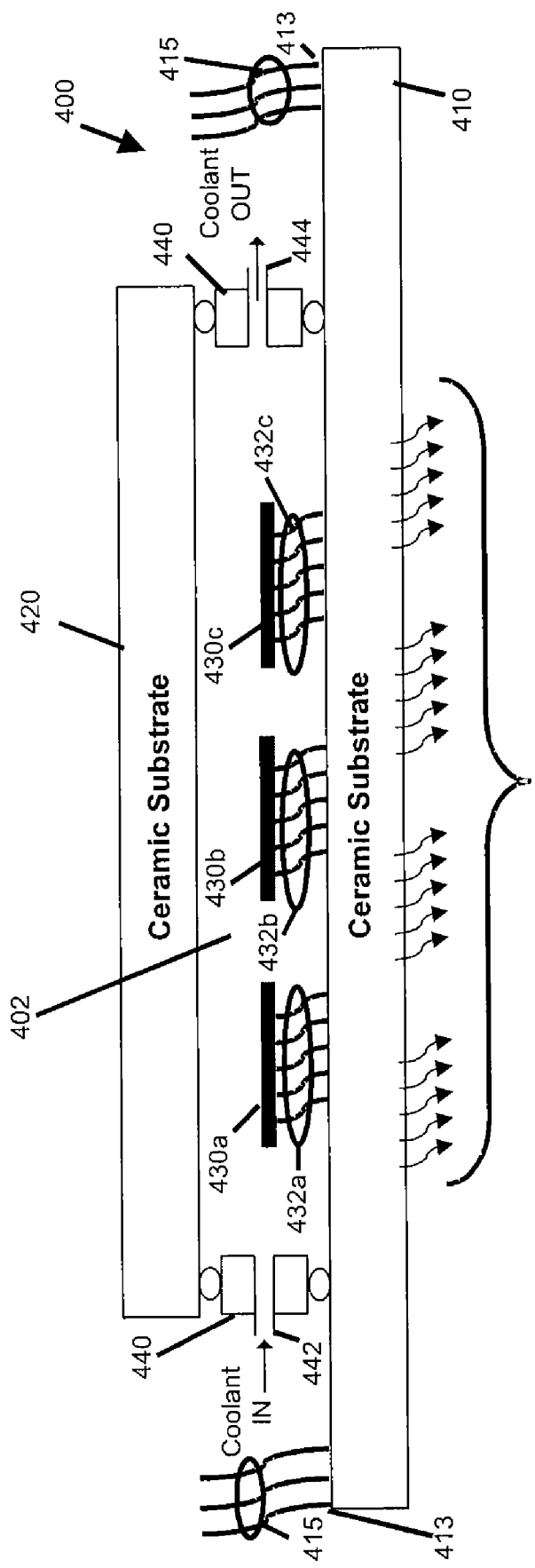
FIG. 4A is a diagram of a high-density cooled package with output contacts at the edge of a substrate according to an embodiment of the present invention.

FIG. 4A is a diagram of a high-density cooled package 400 according to an embodiment of the present invention. High density cooled package 400 includes a housing made up of a bottom ceramic substrate 410 and top ceramic substrate 420. Top and bottom ceramic substrates 410 and 420 are sealed by a seal 440 and enclose a cavity 402. Seal 440 can be any type of seal that can retain a coolant. In one example, seal 440 is an O-ring.

An array of dies 430a-430c are coupled to a surface of bottom ceramic substrate 410 within cavity 402. Any number of dies 430 may be used to cover the available surface area (also called package component area) on the surface of the bottom ceramic substrate 410 within cavity 402. In one embodiment, sixty-four dies are provided in a densely packed, multi-chip arrangement.

In one preferred embodiment, each of the dies 430a-430c are coupled to the bottom ceramic substrate 410 through respective compliant interconnects 432a-432c. Dies 430 are further mounted to face bottom ceramic substrate 410. In particular, an active surface of the die 430a faces bottom ceramic substrate 410. Active surfaces of other dies 430b-430c similarly face bottom ceramic substrate 410.

In FIG. 4A, two coolant ports 442, 444 are shown. Coolant port 442 allows coolant to pass into cavity 402. Coolant port 444 allows coolant to exit cavity 402. In one example, coolant ports 442 and 444 are one-way fluid flow valves. Within cavity 402, the coolant freely circulates around all sides of dies 430 and compliant interconnects 432. The coolant directly cools active electronic components on dies 430. In this way, the present invention reduces the magnitude of thermal gradients across each die and makes remaining thermal gradients more even across each die. Hot spots are reduced or eliminated. By minimizing temperature variation across the die with direct cooling, high-density package 400 reduces electrical parameter variation and parasitics, and provides an improved uniformity of output signal characteristics such as rise time and pin-to-pin skew.

High-density package 400 includes interconnections 205 coupled to a bottom surface of bottom ceramic substrate 410. Interconnections 205 can pass signals into package 400. High-density package 400 also has contacts 413 provided on an edge region of the bottom ceramic substrate 410. Contacts 413 are electrically coupled to interconnection elements 415. In one example, output contacts 413 can be a land grid array (LGA) pattern. Interconnection elements 415 can be any type of electrical interconnection element, including but not limited to compliant interconnects. Interconnects 415 are further coupled to pass signals from dies 430 out of package 400 to any external component. For example, interconnects 415 can be coupled to an interposer, printed circuit board, computer, processor, or other external component.

Figure 4B:
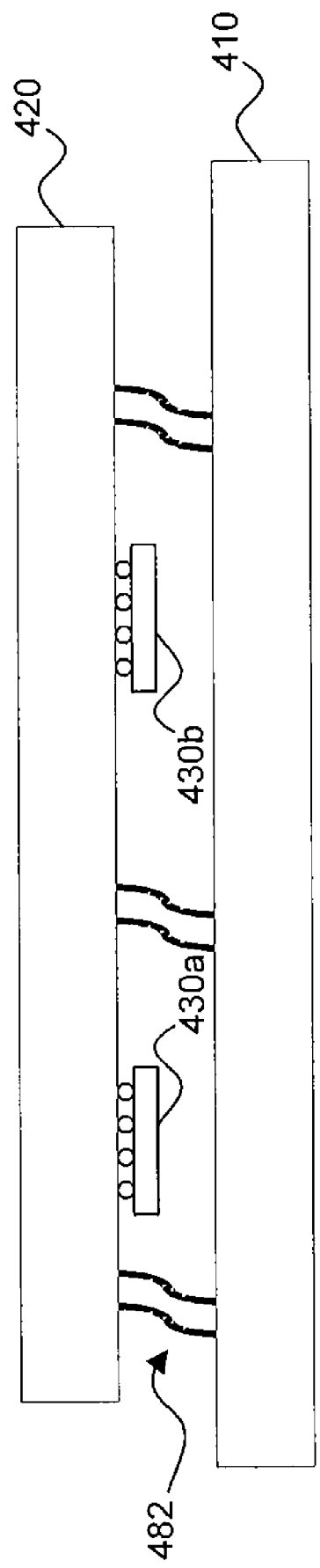
FIG. 4B is a diagram that shows dies mounted in a stacked die arrangement according to an embodiment of the present invention.

FIG. 4B is a diagram that shows dies 430a, 430b mounted in a stacked die arrangement according to an embodiment of the present invention. Dies 430a, 430b are flip-chip bonded to top substrate 420. Top substrate 420 is then coupled by compliant interconnects 482 to bottom substrate 410. This stacked die arrangement can be implemented in any of the cooled packages described herein including but not limited to high-density cooled packages. Coolant circulates around dies 430a, 430b to directly cool die surfaces.

FIG. 4C is a diagram that illustrates non-contacting compliant interconnects 494 provided on a die surface 430a according to a further feature of the present invention. Coolant circulates around die 430a, compliant interconnects 432a, and non-contacting compliant interconnects 494 to directly cool die surfaces. Non-contacting compliant interconnects 494 can be any type of compliant interconnect such as a spring. As shown in FIG. 4C, non-contacting compliant interconnects 494 do not contact bottom substrate 410, but serve to direct heat away from areas of the die surface. This further improves cooling of die(s) in a cooled package according to the present invention. This arrangement of one or more dies with non-contacting compliant interconnects can be implemented in any of the cooled packages described herein including but not limited to high-density cooled packages.

Figure 5:
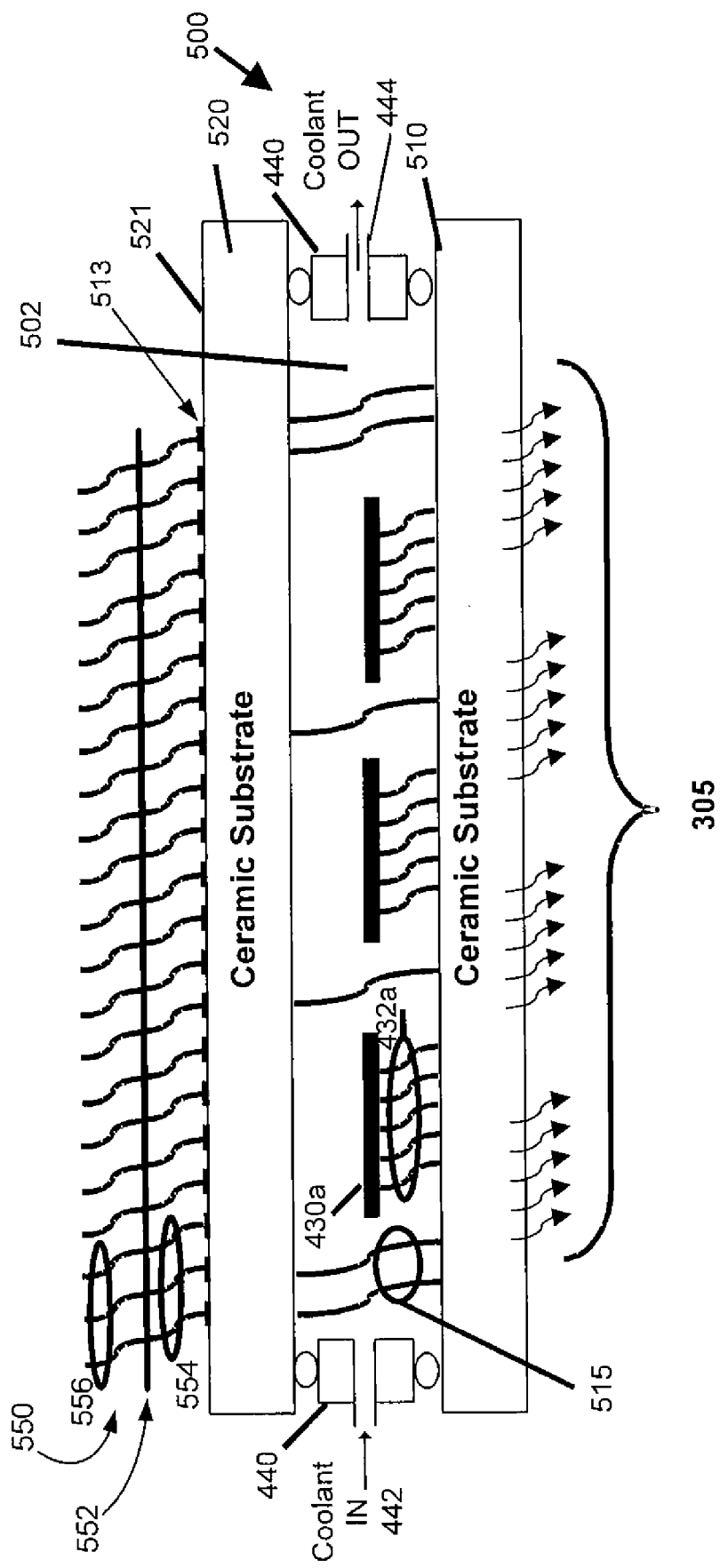
FIG. 5 is a diagram of a high-density cooled package with electrical connection through a housing cavity and output contacts on a top ceramic substrate according to an embodiment of the present invention.

FIG. 5 is a diagram of a high-density package according to a further embodiment of the present invention. High-density package 500 includes a housing that encloses a cavity 502. The housing includes a bottom ceramic substrate 510 and top ceramic substrate 520. Top and bottom ceramic substrates 510 and 520 are coupled in a sealed package by seal 440. Coolant ports 442 and 444 allow the circulation of a liquid coolant through cavity 502, as described above with respect to FIG. 4A. Bottom ceramic substrate 510 is coupled on one surface to interconnection elements 205. Another surface of bottom ceramic substrate 510 is coupled to dies 430 through compliant interconnects 432.

Unlike package 400, package 500 includes output contacts 513 provided on a top surface 521 of top ceramic substrate 520. Output contacts 513, for example, can be a LGA pattern. Also, interconnections 515 are provided through cavity 502 between top and bottom ceramic substrates 510, 520. A number of interconnections 515 can be provided as desired. Package 500 has all the advantages described above with respect to package 400, in that the thermal gradients in dies 430 are reduced. Package 500 is even more compact, in that the output contacts do not have to be provided on an edge region of the bottom ceramic substrate 510. Instead, output contacts 513 are provided on the top surface 521 of top ceramic substrate 520. In this way, electrical signals can pass through output contacts 513 to any external components.

Figure 6:
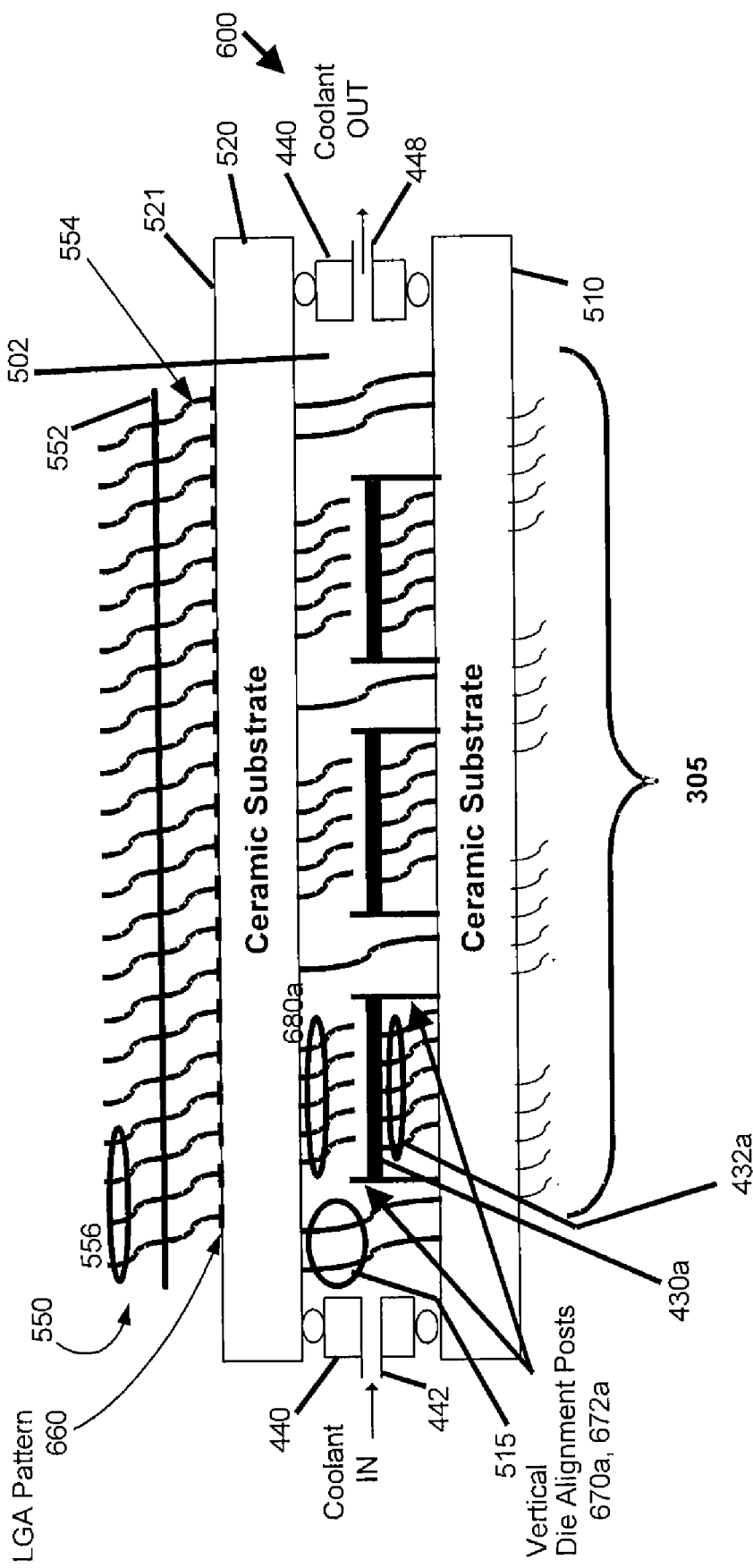
FIG. 6 is a diagram of a high-density package illustrating dies attached in a socket configuration according to an embodiment of the present invention.

FIG. 6 is a diagram of a high-density package 600 according to a further embodiment of the present invention. High-density package 600 is identical to package 500, except that the dies 430 are coupled to bottom ceramic substrate 510 in a socket configuration. Die alignment posts 670,672 are provided for each die 430. In FIG. 6, die alignment posts 670a, 672a are provided on opposite sides of die 430a. Die 430a is held by frictional contact with die alignment posts 670a and 672a, and by compliant interconnections 432a and 680a, to maintain its position. In particular, compliant interconnections 680a provide a downward pressure to hold dies 430s in place in the sockets. Coolant provided within cavity 502 is still able to circulate on exposed sides of the die 430. Even though FIG. 6 shows a socket configuration of dies with respect to the high-density package 500, the present invention is not so limited. In particular, a socket configuration can also be used in any cooled package having any number of dies or any layout of dies by providing die alignment posts. Output contacts 513, shown in FIG. 6 as LGA pattern 660, are provided on the top surface 521 of ceramic substrate 520. Compliant interconnects 662 permit connection to external components, but it should be understood that other types of interconnection elements may be used.

7. Cooled Package with Heat Radiator

Figure 7:
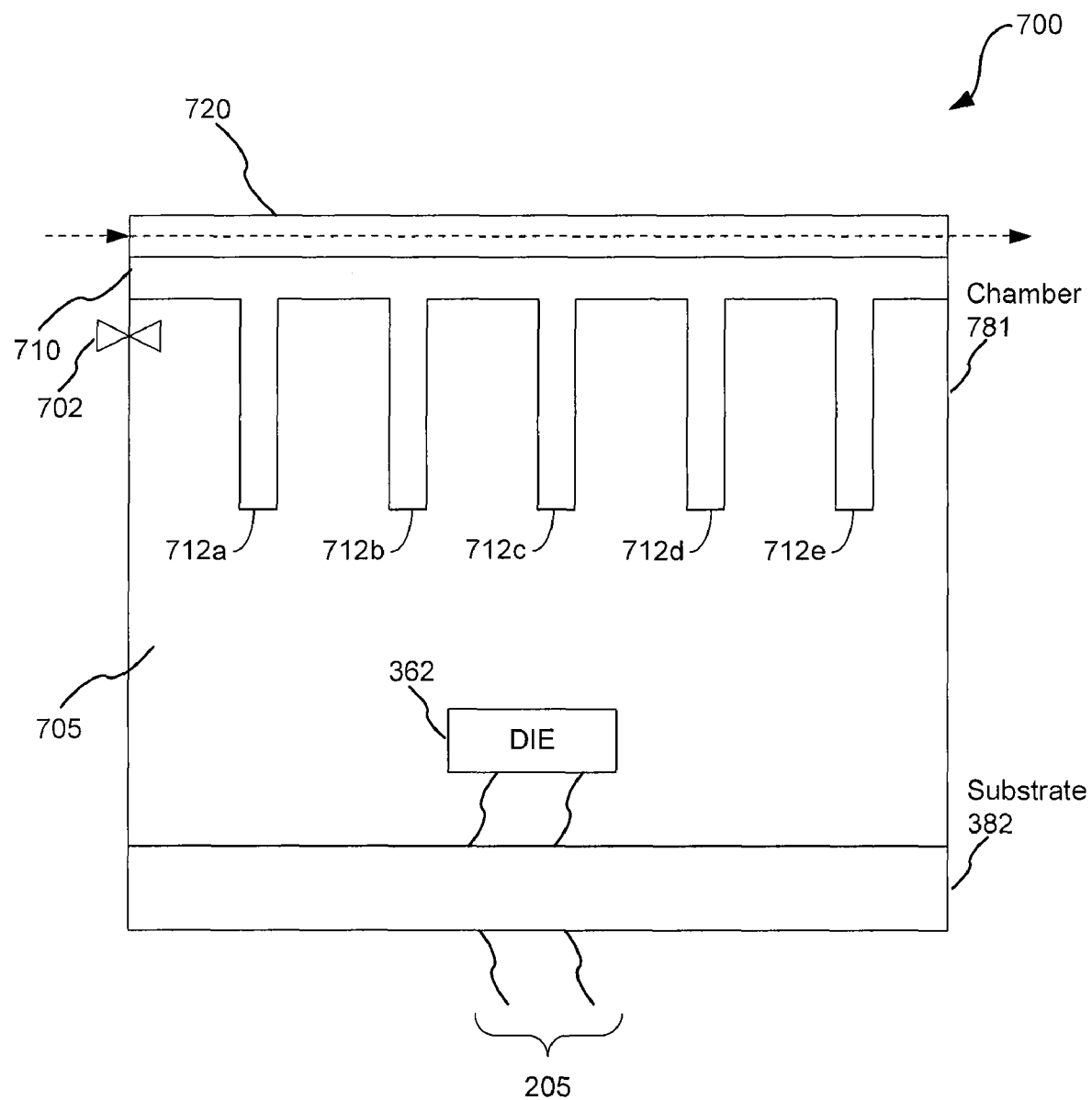
FIG. 7 is a diagram of a cooling assembly and direct cooled package according to an embodiment of the present invention.

As shown in a side view in FIG. 7, in another embodiment of the present invention, a cooling assembly 700 includes a cooling member 720 and a cooled package with one or more heat radiators 710 such as cooling fins 712a-712e. The cooled package includes a chamber 781 that encloses a cavity 705. Liquid or gas coolant is added through a valve 702 to fill cavity 705 and immerse one or more dies 362 located on substrate 382. During operation, die(s) 362 are directly cooled by surrounding coolant. Heat is transferred away from the coolant by the one or more heat radiators 710 to the cooling member 720. Cooling member 720 includes a liquid or gas coolant that circulates through cooling member 720 to further remove heat.

8. Types of Spring Contacts

According to a further feature of the present invention, spring contacts are used within a cooled package to couple one or more dies to a substrate. Such spring contacts have an advantage in that they allow coolant to flow around all sides of a die and around the spring contacts themselves without impairing electrical connection between the die and the substrate. The spring contacts are not completely rigid and can maintain their physical integrity in the presence of circulating coolant. Also, the spring contacts can enhance direct cooling as they have a length that allows coolant circulation and thermal transfer away from an active surface of a die even if the die is mounted to face a substrate. Spring contacts are also fairly strong by themselves and do not require the use of epoxy or other material which would reduce the surface area on a die which is directly cooled by circulating coolant.

Any type of spring contact can be used in a cooled package according to a further feature of the present invention. A spring contact (also referred to as a compliant interconnect, contact spring or spring) can include, but is not limited to, any spring contact available now or in the future from FormFactor, Inc. a Delaware corporation. For example, three types of example spring contacts that can be used in a cooled package according to the present invention are wirebond, multipart lithographic, and integrally formed springs.

FIGS. 8-11 are diagrams of three types of example spring contacts that can be used in a cooled package. The first type is a wirebond spring contact. FIG. 8A illustrates an exemplary conductive spring contact 810 that may be secured to an input/output terminal 804 on a substrate 802. The exemplary spring contact 810 comprises an inner core 830 made of a readily shapeable material and a coating material 832 made of a resilient material. The spring contact 810 is preferably made by wire bonding the inner core 830 to the input/output terminal 804. Because the inner core 830 is made of a readily shapeable material, the inner core may be formed in just about any shape imaginable, including without limitation shapes having a bend or change of direction as illustrated in FIG. 8B, and shapes having multiple changes in direction. Then, the coating material 832 is applied over the inner core 830. The coating material 832 gives the spring contact 810 resiliency. Many variations of the spring 810 are possible. For example, additional layers of materials may be added to the spring contact for a variety of purposes.

Figure 8A:
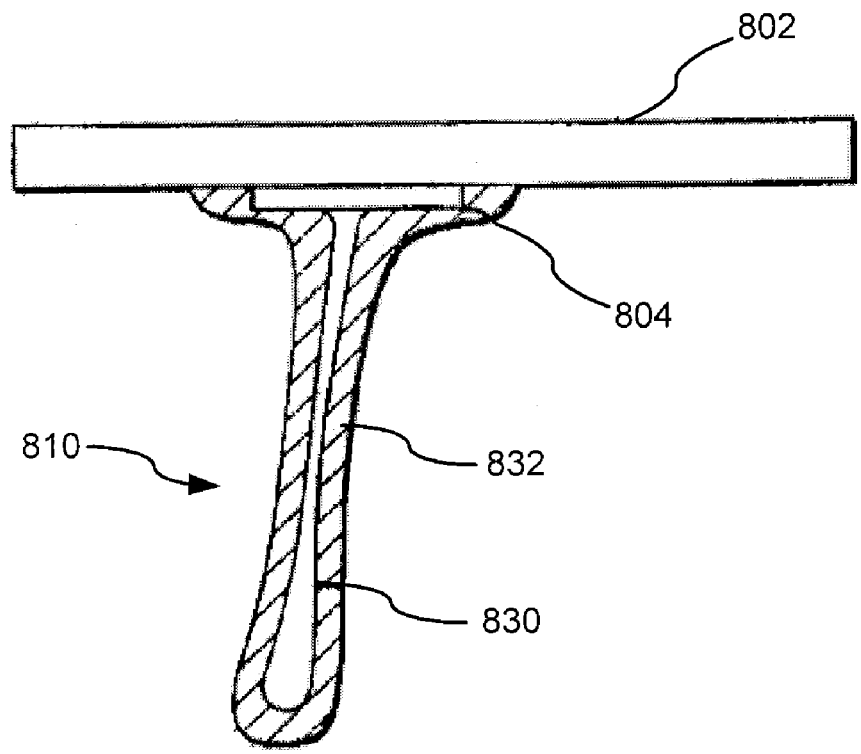
FIGS. 8A and 8B illustrate examples of wire bond spring contacts.
Figure 8B:
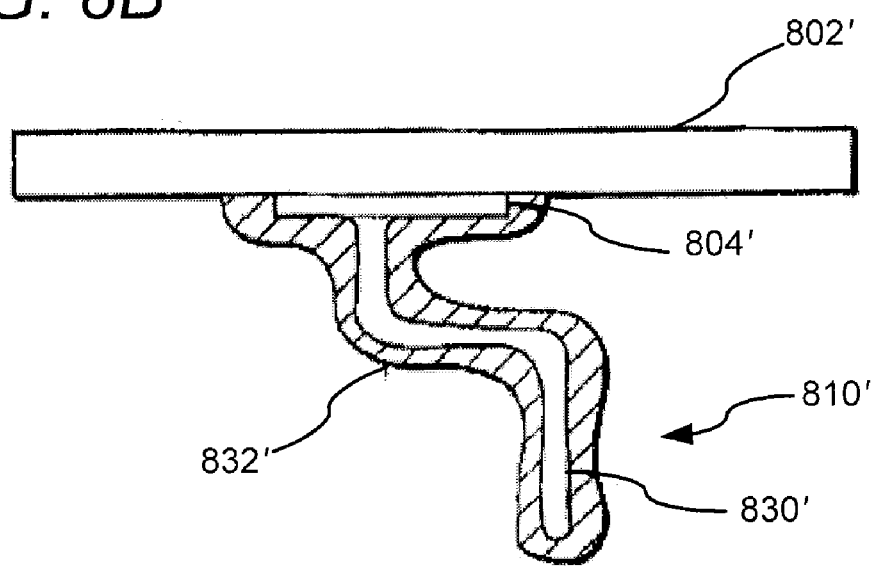

FIG. 8B shows an example spring 810' having two bends. Spring 810' includes an inner core 830' made of a readily shapeable material and a coating material 832' made of a resilient material. Spring contact 810' is preferably made by wire bonding the inner core 830' to the input/output terminal 804'. Then, the coating material 832' is applied over the inner core 830'. Further details regarding the construction of spring contacts are described in commonly-assigned U.S. Pat. Nos. 5,476,211, 5,917,707, and 6,110,823, each of which is incorporated herein in its entirety by reference.

Figure 9A:
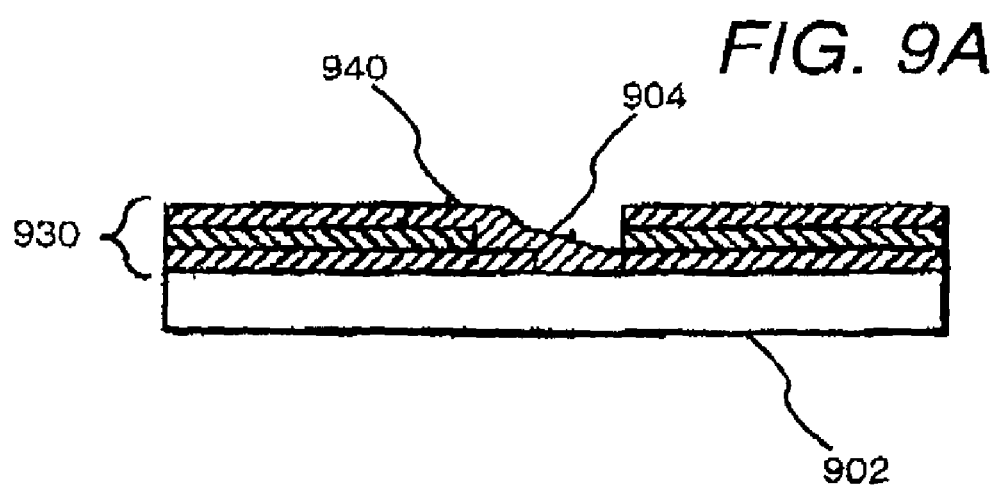
Figure 9B:
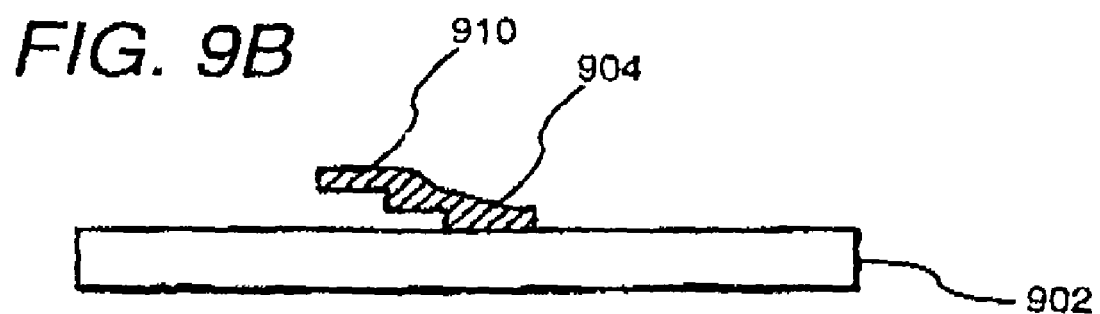

FIGS. 9A, 9B, 10A-10C and 11 illustrate spring contacts that are made with lithographic techniques. Such spring contacts are made using lithographic techniques similar to techniques used for making integrated circuits. That is, one or more masking layers are used to create a pattern in which elements of the spring contact are formed. FIGS. 9A and 9B illustrate an example in which a contact spring is formed lithographically. As shown one or more masking layers 930 are formed on a substrate 902. Masking layers 930 form an opening over an input/output terminal 904 of substrate 902 and also define a shape of the spring contact. Material 940 is then deposited on the pattern formed by the masking layers 930. As shown in FIG. 9B, the masking layers are then removed, leaving a spring contact 910 that is secured to the input/output terminal 904. The spring may be made of a single, springy material. Alternatively, the spring may be made of multiple layers of materials. For example, the initial material 940 deposited in the masking layers 930 may be a flexible material such as forms the inner core of the springs illustrated in FIGS. 8A and 8B. That material may then be coated, for example, after the masking layers are removed, with a resilient material as described above with regard to FIGS. 8A and 8B.

Figure 10A:
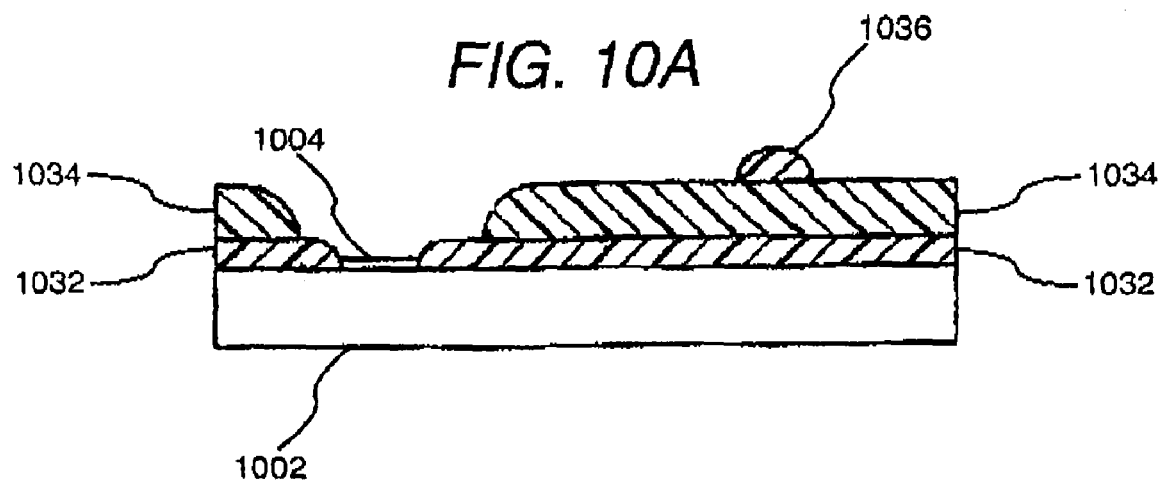
Figure 10B:
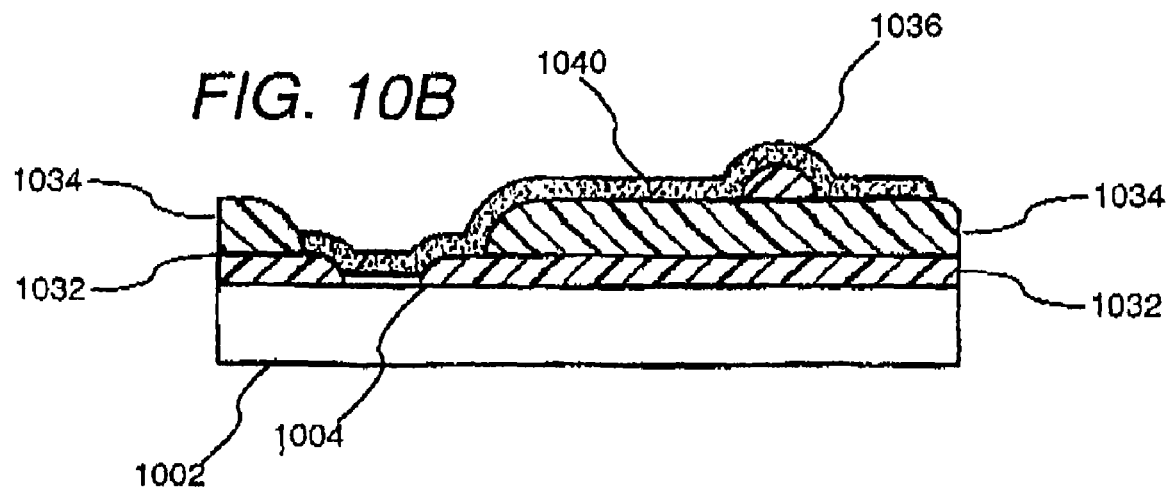
Figure 10C:
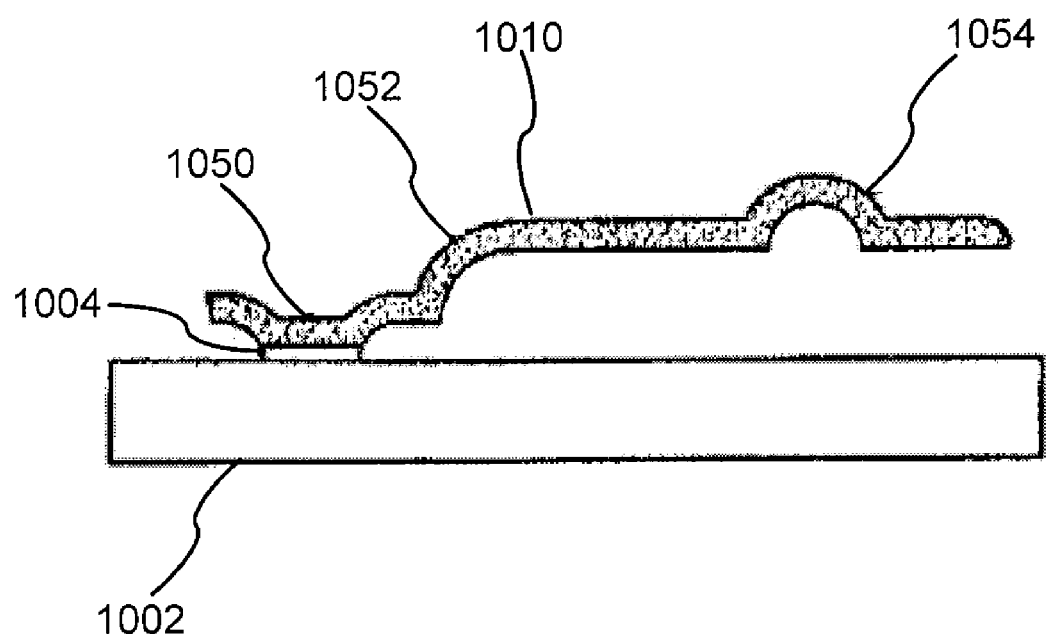

The shapes and configurations of contact springs formed lithographically are almost limitless. FIGS. 10A-10C and 11 illustrate nonexclusive examples of such shapes and configurations. In FIG. 10A, a plurality of masking layers 1032, 1034, 1036 define a spring shape at an input/output terminal 1004. As shown in FIGS. 10B and 10C, depositing a spring material or materials 1040 on the masking layers and then removing the masking layers forms a spring 1010 having a base portion 1050 secured to the input/output terminal 1004, a beam portion 1052, and a contact portion 1054.

Figure 11:
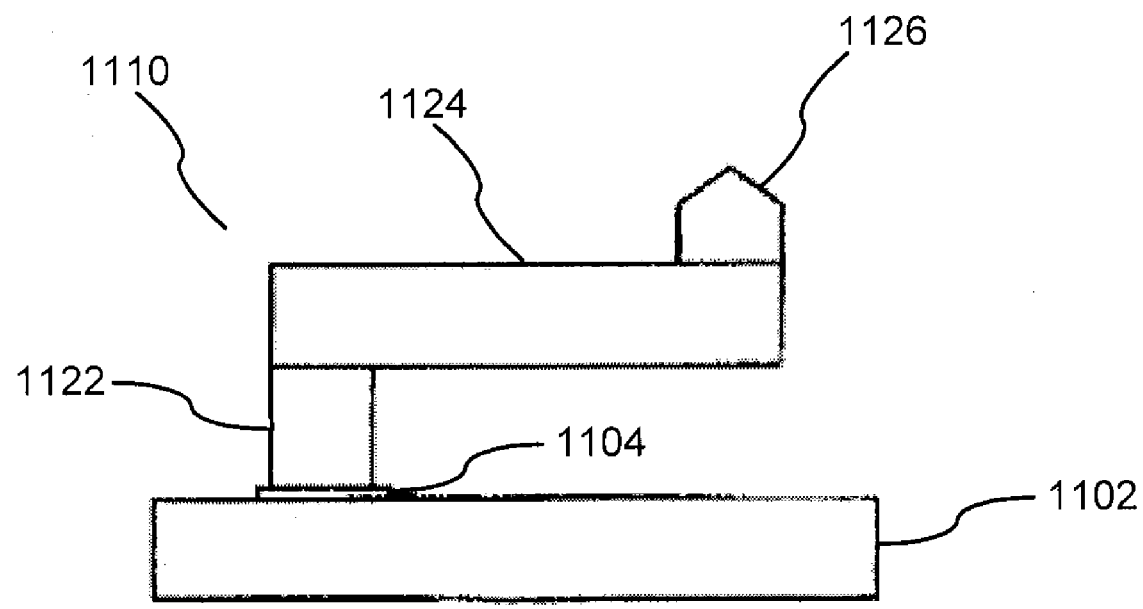

FIG. 11 illustrates an example of a multi-part lithographically formed spring contact 1110 in which distinct post 1122, beam 1124, and tip 1126 portions are created. Typically, the post 1122 is created by forming a first masking layer (not shown) over a substrate 1102 with an opening over an input/output terminal 1104 defining post 1122. The opening is then filled, forming the post 1122. Thereafter, a second masking layer (not shown) is formed over the first masking layer, defining an opening that includes the post 1122 and defines the beam 1124. The beam 1124 is then created by filling the opening with a material. The process is then repeated with a third masking layer (not shown) defining the tip 1126.

It should be noted that, rather than form springs on the substrate, springs may be formed separately from the substrate and, once formed, attached to the substrate. Further and more detailed descriptions of lithographically formed spring contacts may be found in commonly-assigned U.S. patent application Ser. No. 09/032,473, filed Feb. 26, 1998 (PCT publication WO 9852224), U.S. patent application Ser. No. 09/205,023, filed Dec. 2, 1998, and U.S. Pat. No. 6,255,126, all three of which are incorporated by reference herein in their entirety.

These spring contacts are illustrative examples of compliant interconnection elements and not intended to limit the present invention. Any interconnection element including, but not limited to, compliant interconnection elements may be used to couple one or more dies within a cooled package in a cooling assembly according to the present invention.

9. Conclusion

The previous description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. A method for cooling a packaged die comprising:
providing a die within a cavity in a package;
placing a liquid coolant into the cavity such that the die is immersed in and surrounded by the coolant;
operating the die causing the die to generate heat;
transferring the heat from the die into the liquid coolant causing the liquid coolant to microboil at a contact surface of the die to produce vaporized coolant; and
recirculating the vaporized coolant through a liquefier to return re-liquefied coolant to the chamber.

2. The method of claim 1, wherein the providing comprises providing a plurality of dies within the cavity.

3. The method of claim 1, wherein the liquid coolant is in contact with an active surface of the die.

4. The method of claim 1, wherein the liquid coolant is in contact with substantially all exterior surfaces of the die.

5. The method of claim 1, wherein the liquid coolant at the contact surface maintains a substantially constant temperature.

6. The method of claim 1, wherein the contact surface maintains a substantially constant temperature.

7. The method of claim 1, wherein the placing comprises placing liquid coolant between an attachment surface of the die and an attachment surface of the package, wherein the attachment surface of the die is attached to the attachment surface of the package via elongate contact elements.

8. The method of claim 1, wherein the attachment surface is an active surface of the die.

9. The method of claim 1, wherein the recirculating comprises:
removing the vaporized coolant from the cavity;
removing heat from the vaporized coolant to re-liquify the coolant; and
returning the vaporized coolant to the cavity.

* * * * *